United States Patent [19]

Six et al.

[11] 4,338,530
[45] Jul. 6, 1982

[54] LOW-PASS FILTER FOR LOW-FREQUENCY SIGNALS

[75] Inventors: Jean-Claude G. Six, Versailles; Jean-Claude Kaire, Caen, both of France

[73] Assignee: U.S. Philips Corporation, New York, N.Y.

[21] Appl. No.: 117,718

[22] Filed: Feb. 1, 1980

[30] Foreign Application Priority Data

Feb. 2, 1979 [FR] France .................................. 79 02759

[51] Int. Cl.³ .......................... H03F 3/72; H03F 3/18; H03F 3/183; H03L 7/00
[52] U.S. Cl. .................................. 307/520; 328/127; 328/147; 328/167; 330/150; 307/491
[58] Field of Search ................ 307/520, 491; 330/149, 330/150; 328/127, 167, 147

[56] References Cited
U.S. PATENT DOCUMENTS

| | | | |
|---|---|---|---|
| 3,753,159 | 8/1973 | Burwen | 307/520 |
| 4,215,280 | 7/1980 | Mahig | 307/520 X |
| 4,257,006 | 3/1981 | Schaumann | 328/127 |

*Primary Examiner*—John S. Heyman
*Attorney, Agent, or Firm*—Thomas A. Briody; William J. Streeter; Laurence A. Wright

[57] ABSTRACT

A low pass-filter for low frequency signals having first portions situated above on one side and second portions situated on the other side of an average value.

The filter comprises at least two integrators, each comprising a capacitor, included between the input and the output of a voltage-inverting amplifier, and a current source connected to said output, and three threshold comparators, of which the first one is connected to the input of the filter, of which the second one is included after the first integrator, and of which the third one is connected to the output of the filter.

The arrangement is used in logic circuitry.

15 Claims, 16 Drawing Figures

LOW-PASS FILTER FOR LOW-FREQUENCY SIGNALS

The invention relates to a low-pass filter for low-frequency signals having first portions situated on one side and second portions situated on the opposite side of an average value.

BACKGROUND OF THE INVENTION

The importance of timer circuits in modern small domestic appliances is increasing constantly. In addition, integrating these circuits and realizing them in the form of integrated circuit is of importance for these appliances in order to minimize the dimensions of these appliances and in view of the savings thus obtained.

Such appliances frequently comprise a device which produces generally rectangular pulses spaced by a specific time interval. These pulses are supplied to a counting device. When this device, which has been preset to specific time, has received the number of pulses corresponding to said time, the timer supplies the starting signal for the desired operation.

For such a use it is effective to employ the power frequency as frequency reference, or clock, which frequency in the major countries is maintained very stable at a fixed value: 50 Hz in Europe and 60 Hz in the U.S.A.

Unfortunately, although the basic frequency is maintained stable at a source, the power mains is often disturbed by spurious signals whose frequency is generally higher than a few hundreds of Hz, which spurious signals affect the signal waveform and may disturb the counting process. Spurious signals in the range from 1 to 3 kHz occur very frequently and are very annoying.

For a long time it has been attempted to eliminate said spurious signals by means of low-pass filters, but with the present state of the art it is impossible to integrate such low-pass filters on a monolithic crystal. Indeed, this would require the use of capacitances of several microfarads, which cannot be integrated.

French Patent Application No. 2,363,220 for example describes a filtered power supply for this purpose, which is integrated except for the capacitor.

The present invention provides a solution to the said problems.

It takes into account that filtering is mainly required for logic circuits and that in such circuits sources supplying a small current can readily be realized, in particular in I$^2$L technology (integrated injection logic).

It is to be noted that in the present Application "main electrodes" is to be understood to mean those electrodes in which a large current flows, i.e. the emitters and the collectors in bipolar transistors, as distinct from the control electrodes, which in bipolar transistors are constituted by the bases.

SUMMARY OF THE INVENTION

The present invention relates to a low-pass filter for low-frequency signals having first portions situated on one side and second portions situated on the opposite side relative to an average value, characterized in that said filter comprises at least a first and a second voltage inverting integrator, connected in series, of which the first integrator is mainly operative for said first portions and the second integrator for said second portions, each integrator comprising a voltage-inverting current amplifier, between whose inverting input and output a capacitor is included, the non-inverting input being connected to a point of fixed voltage, and a constant-integration-current source connected to the output of said amplifier, that the input of each of said amplifiers is connected to a constant-control-current source of said integrator via a switch controlled by a threshold comparator, that the input of said filter is connected to the first threshold comparator of said first integrator, that the output of said first integrator is connected to the second threshold comparator of said second integrator, that the output of said second integrator is connected to an output threshold-comparator connected to the output of the filter, that the capacitance values of said capacitors, the current gain factors of said amplifiers, the currents supplied by the current sources, the relative level of the input voltage and the threshold voltages are such that the integration time of each of said integrators is greater than 0.1 and smaller than 1 times the duration of the shortest of the signal portions for which said integrator is operative and that the discharge time of each of said integrators is, at the most, equal to said integration time of said integrator.

The present invention has several advantages. Filtration is particularly effective, especially in the case of short closely-spaced spurious signals. The first integrator completely eliminates first portions of the signal (in particular half-periods situated on one side of an average value), the spurious signals having a duration smaller than said integration time of said integrator. The second integrator associated with the comparators eliminates a substantial part of the spurious signals affecting the second signal portions or half-periods related on the other, opposite side of said average value. This may be explained in terms of negative feedback, i.e. each time that the voltage at the output of the amplifier increases there is a counteraction at the input of the amplifier; these counteractions have a braking effect and the system can only vary very slowly. It is also possible to say that the capacitor shunts all high frequencies to earth and allows low frequencies to pass through.

Advantageously, said integration time is smaller than 0.7 times the duration of the shortest signal portions for which said integrator is operative.

The device is reliable. Moreover, it can be miniaturized and integrated on a monolithic chip.

In said low-pass filter it is advantageous if between the output of the second integrator and the input of the output threshold-comparator there is included an additional voltage-inverting integrator which also comprises:

an additional voltage-inverting current amplifier between whose inverting input and output an additional capacitor is included, the non-inverting input being connected to a point of fixed voltage, an additional constant-integration-current source connected to the output of said amplifier, the input of said additional amplifier being connected to a constant-control-current source of said additional integrator via a switch which is controlled by an inverting threshold-comparator, whose input is connected to the output of the second integrator, the output of said additional integrator being connected to said output threshold-comparator, whose output is connected to the output of the filter, and the capacitance values of said capacitors of said three integrators, the current-gain factors of said amplifiers, the currents supplied by the current sources, the relative level of the input voltage and threshold voltages being such that the integration time of said integrators is greater than 0.1 and smaller than or equal to 0.5 times the duration of the shortest of the second signal portions and the discharge time of each of said integrators being, at the most, equal to said integration time of said integrator.

Said third integrator in particular eliminates spurious signals of high amplitude which may appear in the middle of the second signal portions (signal portions situated on the other side of the average value than the first portions filtered by the first integrator).

In fact, since square wave pulses are generally obtained by clipping sine wave signals, most spurious signals appearing in the middle of each half-period are eliminated or have a reduced amplitude as a result of clipping. The third integrator is therefore useful if perfect filtering is required.

It is to be noted that the invention employs an effect which is known (by an inexact but convenient term) as "effective capacitance multiplier". Such "Miller" arrangements are discussed in the chapter "Integration", page 78 of the paper "Electronics Instruments", Volume 21 of the series "Radiation Lab. Series" published in 1948 by Mac Graw Hill of New York. This arrangement is for example used in U.S. Pat. No. 3,553,609 in order to obtain variable reactances, but this an entirely different object than that of the present invention.

Advantageously, said integration time of each of said integrators is greater than 0.3 times the duration of the shortest of the signal portions for which said integrator is operative. Thus, it is particularly suitable for elminating very harmful spurious signals.

In order to eliminate very short spurious signals occurring in said half-period for which the second integrator is operative, it is favourable if the capacitors, and in particular the capacitor of the first integrator, have a discharge time between 0.01 and 0.2 times the duration of the shortest of the signal portions for which said integrator is active.

This arrangement enables the afore-mentioned additional integrator to be dispensed with.

Said very short spurious signals occurring in said half-period for which the second integrator is operative may also be eliminated by giving the second integrator a longer integration time than the integration time of the first integrator, up to for example two times this integration time.

This arrangement can be realize more easily than the preceding arrangement. Suitably, the point of fixed voltage to which the non-inverting input of the amplifier of the first integrator is connected is the same as the point of fixed voltage to which the non-inverting input of at least one of the amplifiers of the other integrators of the filter is connected, which simplifies the arrangement. Suitably, this common point is connected to earth.

Advantageously, the integration-current source of the first integrator and the control-current source of the second integrator are the same, which yields a simplification and reduces the power consumption.

Preferably, said filter comprises a current source, hereinafter referred to as output-current source, and the output comparator controls the state, i.e. open or closed, of a switch included between said output-current source and an output-tapping of the filter.

Suitably, said integration-current source of the last integrator and said output-current source are the same, which yields a smplification and saves power.

Suitably, a diode in the reverse direction is included between the input and the first threshold comparator, which prevents that an external current from the input, when it is in the high state, can flow into the filter.

Advantageously, the same reference voltage is used for the threshold comparators, which simplifies the circuit arrangement and, preferably, said threshold comparators and the switch controlled thereby are realized by means of a bipolar transistor, whose one main electrode is connected to the current source, whose other main electrode is connected to the input of the corresponding amplifier, and whose base is connected to the reference voltage.

For applications with a symmetrical signal, it may be convenient to provide two substantially identical integrators, which simplifies the structure.

Depending on the desired gain, the amplifiers may be constituted by either a single transistor, which is preferably connected in a common-emitter arrangement, which enables a current gain factor of the order 100 to be obtained and has the advantage that it is simple, or an arrangement with a plurality of transistors, In a preferred embodiment use is made of two bipolar transistors of the same type, the first one being the input and the second one the output transistor, connected in "normal Dalington" arrangement, the emitter of the first transistor, whose base constitutes the input of said amplifier, being connected to the base of the second transistor, whose emitter is connected to earth, the collectors of said two transistors being interconnected and being connected to the corresponding integrating current source and constituting the amplifier output. This arrangement enables a high current-gain factor $\beta$ to be obtained, for example of 10,000 in the case of NPN transistors; this enables the use of capacitors with a very low capacitance, which can readily be integrated, and/or the filtration of very low frequencies.

The present invention may be used for filtering short spurious signals on currents of low frequency, specifically of the power frequency, in devices operating with symmetrical or non-symmetrical pulses and even non-periodic pulses, especially in data transmission systems.

BRIEF DESCRIPTION OF THE DRAWINGS

The invention and how it can be realized and utilized is explained by means of the following description with reference to the accompanying drawing wherein.

It is to be noted that for the clarity of the figures the exact proportions have not been observed. For example, note in FIG. 3 with respect to the discharge times of the capacitors.

In most cases the NPN-transistors in the above diagrams may be replaced by PNP-transistors and the other way round. The changes which this involves will be observed to those skilled in the art.

Furthermore, it is to be noted that in the following Figures and description the first portions of the signal. i.e. the upper portions are filtered completely by the first integrator. It is obvious that these portions may also be situated on the other side of the average, the threshold comparators being reversed.

DESCRIPTION OF THE PREFERRED EMBODIMENTS

Figure 1:
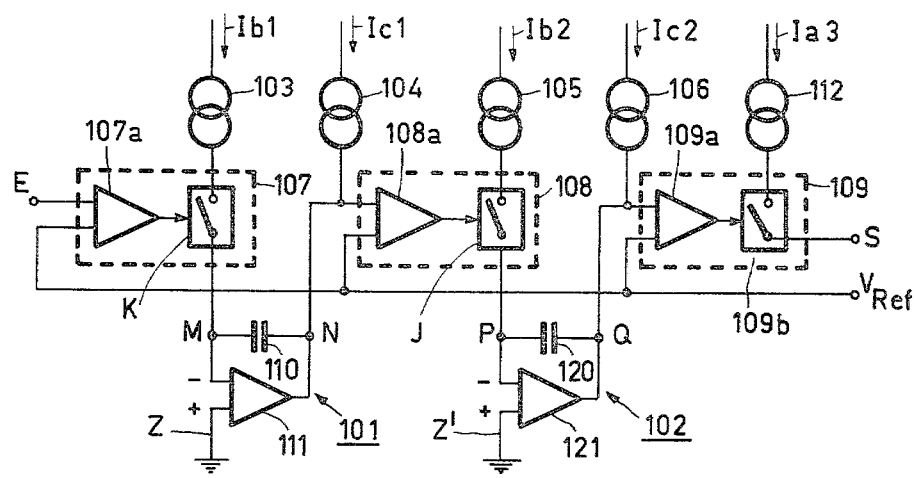
FIG. 1 is a circuit diagram of a filter in accordance with the invention.

In FIG. 1 the two series-connected integrators of the filter are designated 101 and 102, which integrators are each constituted by a voltage-inverting current amplifier 111, 121, whose non-inverting input Z,Z' is connected to earth and whose inverting input M, P and output N, Q are interconnected via a capacitor 110, 120, and by a constant-integration-current source 104, 106, which is connected to the output N, Q of the corresponding amplifier. These two sources respectively supply the currents $I_{c1}$ and $I_{c2}$.

The inverting input M, P of each of said amplifiers is connected to a constant-control-current source 103, 105 via a switch K, J, which is constituted by a combination 107, 108 and controlled by a threshold comparator 107a, 108a. Said two sources respectively supply a current $I_{b1}$, $I_{b2}$.

The plates of the capacitors connected to M or P are hereinafter referred to as "first plate", and those connected to M or Q as "second plates".

The input E of the filter, which receives the supply voltage $V_a$, is connected to the input of the first comparator ($107_a$), the output N of the first integrator is connected to the input of the second comparator 108a of the second integrator; the output Q of said second integrator is connected to the output comparator 109a which controls a switch 109b, the combination of the two being designated 109. The switch 109b controls the passage or interruption of the current $I_a^3$ from the output-current source 112, which constitutes the output signal of the filter. The output signal of the filter in fact represents the state of the comparator 109a. It is available on point S.

Of course, the threshold $V_{T1}$ (FIG. 3) of the first comparator 107a should be situated between the high level $V_{ah}$ and the low level $V_{ab}$ of the supply voltage $V_a$. The voltage at the output of the comparator is hereinafter designated $V_e$. The low level $V_{nb}$ of the output $V_n$ of the first integrator is lower than the threshold $V_{T2}$ of the second comparator and the low level $V_{qb}$ of the output $V_q$ of the second integrator is lower than the threshold of said output comparator. The high levels $V_{nh}$, $V_{qh}$ are equal to or higher than the threshold levels $V_{T2}$ and $V_{T3}$ respectively. Said three comparators are controlled by the same reference voltage $V_R$.

It is to be noted that the operation of the circuit in accordance with the invention is explained hereinafter on the basis of a squarewave input voltage. The choice of this voltage waveform, in comparison with a sine wave, facilitates the explanation of the operation of the circuit arrangement without restricting its use to this type of waveform. Moreover, a sinusoidal supply voltage $V_a$ at the input is converted into a squarewave voltage by the threshold comparator 107a. As a result of this spurious signals situated in the middle of each half-period are already eliminated or substantially reduced. At a mains voltage of 220 V the spurious signals rarely have an amplitude higher than 100 V.

When a capacitor having a capacitance C is included between the input and the output of a device which at the same time constitutes a current amplifier and a voltage inverter, which has a currentgain factor $\beta$ and whose non-inverting input is connected to earth, the so-called "Miller effect" will be obtained between the output of said amplifier and earth.

The situation is then the same as if the combination constituted by the amplifier, the capacitor connected across it and the threshold switch, had been replaced by an arrangement constituted by a capacitor with a capacitance $\beta$ C included between the output and earth in parallel with a threshold switch. For example, for a voltage variation $dV_c$ on the output plate N of the capacitor 110 with a capacitance C, the equivalent electrical charge is equal to C $\beta$ $dV_C$. If the source 104 supplies a current $I_{c1}$, the capacitor would have received this charge after an integration time $W = W = (C\beta dV_c)/I_{c1}$. Suitably, this time should lie between a third and 0.7 times the shortest of the signal portions for which said integrator is operative, i.e. a third and 0.7 times the half-period of a symmetrical periodic signal.

Figure 2:
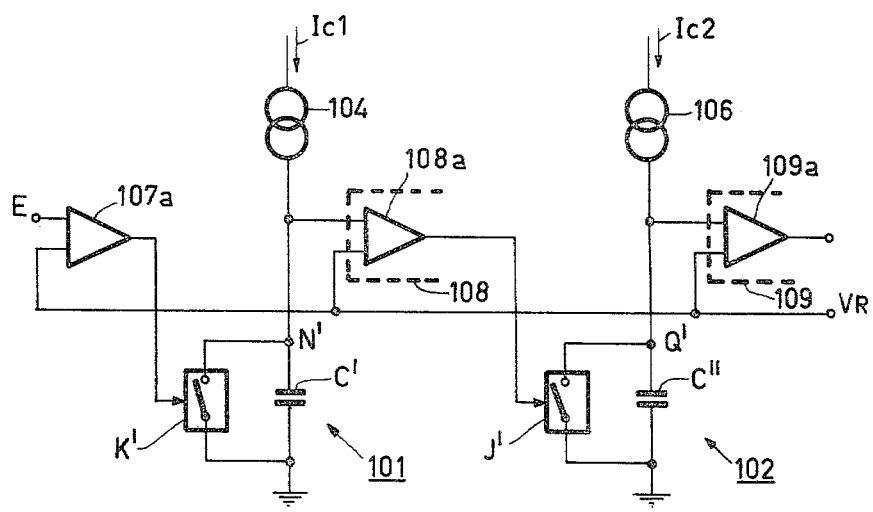
FIG. 2 is a diagram which is roughly equivalent to the filter of FIG. 1.

In order to simplify the description, FIG. 2 shows a diagram which is roughly equivalent to the filter. For example, first of all, the integrator 101 is considered, which again includes a capacitor C', the constant-integration-current source 104, supplying a current $I_{c1}$, the output comparator of said integrator 108a, point N' which is exactly equivalent to N, the comparator 107a of the combination 107, and a switch K' which is only roughly equivalent to the switch K, because its terminals are not the same, since point M is no longer present.

Similarly, the integrator 102 again comprises a capacitor C'', the constant-integration-current source 106 supplying a current $I_{c2}$, the output comparator of the filter 109a, point Q' which is exactly equivalent to Q, and a switch J' it is only roughly equivalent to the switch J, because its terminals are not the same since point P is no longer present.

The situation is the same as if C' and C'' would have values equivalent to $\beta'$C and $\beta''$C, $\beta'$ and $\beta''$ being the current gain factors of the two respective amplifiers.

When the switch K (or K') is closed, point N is pulled to earth. When K (or K') is opened, the capacitance C' is charged by the current $I_{c1}$ in accordance with the formula $I_{c1}dt = C\ dV_c$.

In the second integrator this is the same for the switch J (or J'), point Q, capacitance C'' and for the current $I_{c2}$.

The following calculation is made for the first integrator: if C=3 pF, $\beta'=10,000$, $I_{c1}=3$ μA, $dV_c=1$ V, this yields $C'=\beta'C=10,000\times3\times10^{-12}=3.10^{-8}$ Farads=0.03 μF and $dt=3.10^{-18}/3.10^{-6}=10$ milliseconds per volt, i.e. the half-period at a frequency of 50 Hz.

Thus, by limiting the charging current to a very small value, the time interval necessary to build up said charge can be given a duration which is comparable to that of the half-period of the frequency to be filtered, the optimum value being half said half-period. This limitation, which prevents the capacitance from rapidly being charged, ensures that annoying short spurious signals are not transferred.

The spurious signals to be eliminated by means of the filter are those which would affect counting, i.e. those which during the time in which K' or K is open correspond to a brief closure of K' or K and those which during the time that K' or K is closed correspond to a brief opening of K' (or K). Said spurious signals tend to disturb the situation controlled by the input voltage. This means those spurious signals which, being negative, would set the device to the low state during a positive half-period and those which, being positive, would set the device to the high state during a negative half-period.

Conversely, the spurious signals which tend to maintain the situation controlled by the input present no problem and are not transferred.

A signal which enters at E should take the following path in order to reach S: E, the arrangement 107, points M, N, the arrangement 108, points P, Q, comparator 109, point S. In order to eliminate this signal, it suffices that it is not transferred at one point of the path.

Figure 3:
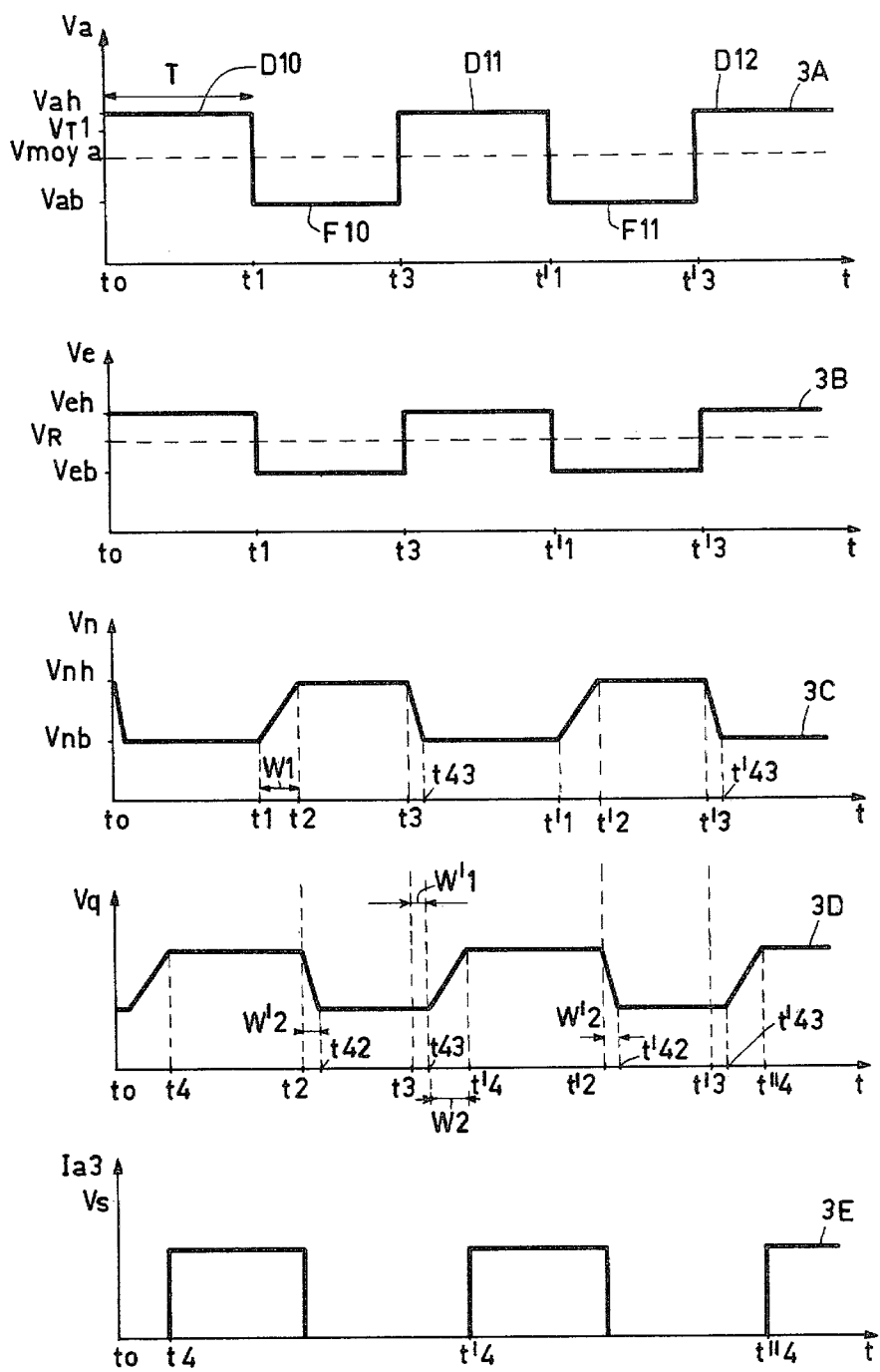
FIG. 3 shows the different waveforms which a symmetrical input signal, which is free of spurious signals, has at various points of a filter in accordance with the invention in its most general form.

The waveforms in FIG. 3, as a function of time to, represent the change of a symmetrical squarewave input with a period 2T which passes through the filter in accordance with the invention. The waveform 3A represents the supply voltage $V_a$ which relative to an average value Vmoya comprises upper portions and lower portions. The waveform 3B represent the voltage $V_e$ leaving the input comparator, the waveform 3C the voltage Vn at the output N of the first integrator, the waveform 3D the voltage $V_q$ at the output Q of the second integrator, and the waveform 3E the current Ia3 or the voltage Vs at the output. Each of these voltages has a high level, indicated by the index h, and a low level, indicated by the index b.

In FIG. 3 in conjunction with FIG. 1 as well as the FIGS. 4, 5, 6, 8, 9, 10, 12 the half-periods and signal portions corresponding to a high level $V_{ah}$ of the supply voltage Va are the first signal portions, i.e. are filtered by the first integrator 101 in FIG. 1. By means of an inverter and/or a comparator 107 operating in an opposite manner the reverse could be obtained, but the principle remains the same.

FIG. 3 covers three half-periods of "first" signal portions respectively designated D10, D11 and D12 and respectively starting at to, at t3 and at t'3, the first two half periods terminating at t1 and t'1. The half-periods corresponding to a low level Vab of the supply voltage are "second" signal portions. FIG. 3 comprises two of these half-periods designated F10 and F11, which respectively start at t1 and t'1 and which terminate at t3 and t'3.

The threshold value VT1 of the first comparator 107a, which is higher than the low level Vab of the supply voltage, is plotted in FIG. 3A.

Furthermore, the reference voltage $V_R$ lies between $V_{eh}$ and $V_{eb}$. In FIG. 3 $V_{eb}$ is represented in a general way, i.e. with a value which is not zero. In the embodiment of which the diagram is given in the Figure $V_{cb}$ is zero. When the voltage $V_e$ has its high level $V_{eh}$, for example between $t_o$ and $t_1$, it closes the switch K K' and the equivalent capacitance C' is short-circuited; the current from the source 104 flows directly to earth, the voltage $V_n$ having its low level $V_{nb}$.

When at the time $t_1$ the voltage $V_e$, which goes to its low level $V_{eb}$, causes the switch K K' to open, the equivalent capacitance C' is charged, the voltage at point N N' increases, but this increase is slowed down by the small value of the current $I_{c1}$ and has a duration $W_1$ from $t_1$ to $t_2$. At the time $t_2$ the voltage at N, $V_n$, reaches its high level $V_{nh}$ whose value is that of the threshold $V_{T2}$ of the second comparator 108a. The integration time $W_1$, which is equal to $t_2$-$t_1$, is smaller than $t_3$-$t_1$, i.e. than S, which is the duration of the half-period and which in FIG. 3 is equal to a third of said half-period. The charge of the capacitor 110 (C') and the level of the voltage level at N, $V_{nh}$, then remain unchanged from the time $t_2$ to the time $t_3$, which is the end of the half-period $F_{10}$ of the "first" value.

As soon as, at $t_3$, the voltage $V_e$ returns to its high level $V_{eh}$, switch K K' is closed again, capacitor 110 (C') discharged and the voltage at N N' returns to its low level $V_{nb}$ at $t_{43}$. The discharge time $W'_1$ is the time between $t_3$ and $t_{43}$.

Discharging is effected to earth via amplifier 111 with the current $I_{b1}$ in accordance with the equation $dv_c=I_{b1}dt$; thus, if $I_{b1}=I_{c1}$, it is $\beta$ times shorter than charging, i.e. if $\beta=100$ almost instantaneously. The discharge time $W'_1$ can be prolonged by reducing $I_{b1}$ or $\beta$.

The waveform 3D represents the voltage at Q at the output of the second integrator, which operates in exactly the same way as the first integrator. When during the half-period $F_{10}$ between $t_2$ and $t_3$ the voltage at N has the high level, the switch J J' is closed and the equivalent capacitance C'' is short-circuited; the voltage at Q, $V_q$, has its low level $V_{qb}$, and the current from the source 106 then flows directly to earth.

When for example at the time $t_3$ the voltage $V_n$, which passes to its low level $V_{nb}$, causes the switch J J' to open, the capacitance C'' is charged, the voltage at point Q Q' increases and this increase, slowed down by the small value of the current $I_{c2}$, has a duration $W_2$ from $t_3$ to $t_4$, which is smaller than the half-period T and, in FIG. 3, equal to a third thereof ($t'_4$ and $t''_4$ denote the points of other half-periods corresponding to $t_4$).

At the time $t_4$, the voltage at Q reaches its high level $V_{qh}$ whose value is equal to the threshold $V_{t3}$ of the third comparator 109a. As long as $V_n$ has its low level $V_{nb}$, switch J J' remains open and the charge of capacitor 120 (C'') remains unchanged.

When $V_n$, for example at $t_1$, begins to leave its low level $V_{nb}$, switch J J' remains open and the charge of capacitor 120 C'' remains unchanged until point N reaches its high level $V_{nh}$ at $t'_2$, whose value is that of the threshold voltage $V_{T3}$ of the threshold comparator 109a. When $V_n$ reaches its high level at $t'_2$ (or at $t_2$) switch J J' is closed, the equivalent capacitance C'' of the capacitor 120 discharges in a time $W'_2$ from $t'_2$ to $t'_{42}$. The voltage $V_q$ goes to its low level $V_{qb}$.

The waveform 3E represents the output current $I_{a3}$ supplied by the source 112 or the output voltage VS across a resistor included at this output between point S and the common point, not shown.

When the voltage at Q, $V_q$ is smaller than the threshold voltage $V_{T3}$ of the output comparator 109a, switch 109b is open and no current from the source $I_{a3}$ flows to the output.

When the voltage at Q, $V_q$, becomes equal to $V_{T3}$, i.e. when it reaches its high level $V_{qh}$, the source 112 will supply a current $I_{a3}$ to the output S. If the logic that follows demands a voltage input, a resistor, not shown, is included between the output S and earth and a voltage Vs is available on point S.

Figure 4:
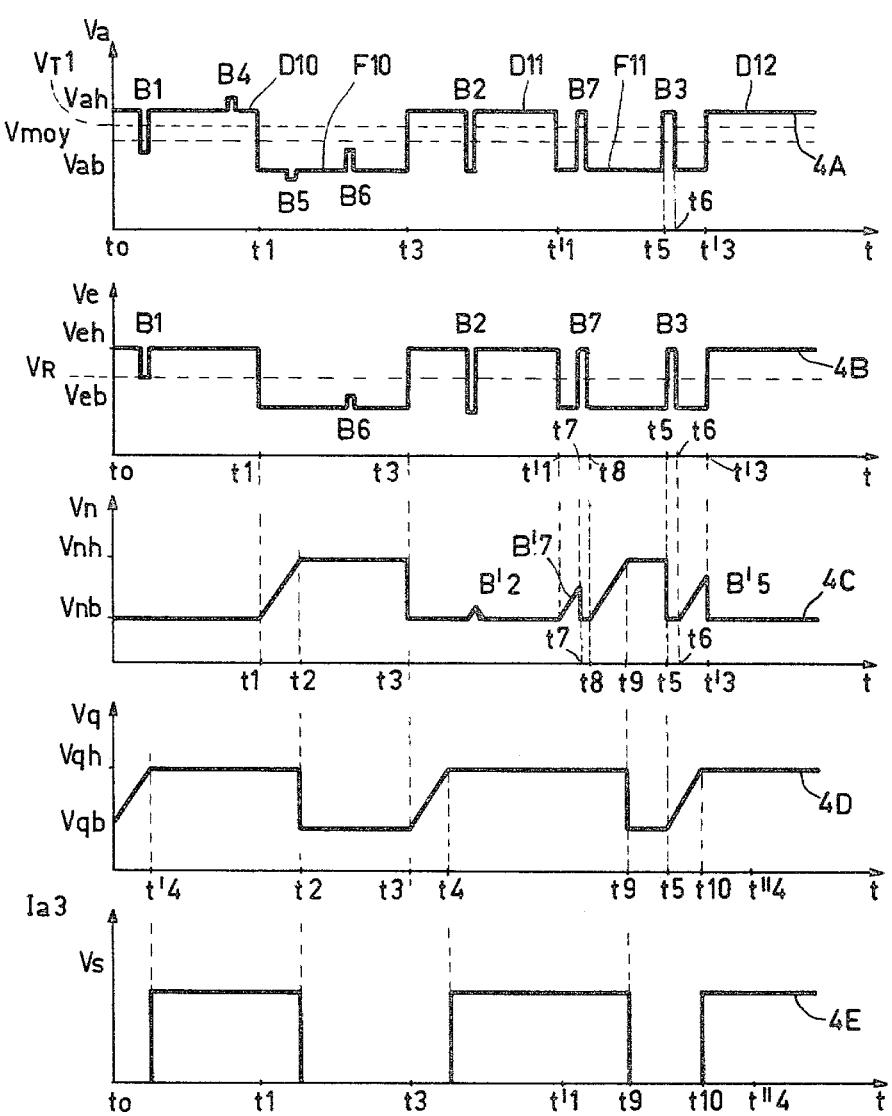
FIG. 4 shows how spurious signals on a symmetrical input signal are eliminated in a filter in accordance with the invention in its most general form.

FIG. 4 represents the change of the signal of FIG. 3 (constituted by the half-periods D10, F10, D11, F11, F12) afflicted with spurious signals. In contradistinction to FIG. 3, the same scale has been adopted for the discharge time, which is generally very short, although it does not appear in the Figures.

The signal of FIG. 4 carries the spurious signals B1 and B4 on D10, D2 and D11, which are half-periods having the "first" value, and B5 and B6 on F10, and B1 and B3 on F11, which are half-periods having the "second" value.

Annoying spurious signals appearing at K K', when V has its high level $V_{ah}$, are those which, being negative, would cause the switch to open and, when $V_a$ has its low level $V_{ab}$, those which, being positive, would cause the switch to close.

As a result of the substantial limitation of the current by the current source 104 negative spurious signals occurring when Va has its high level $V_{ah}$ and tending to open K K', if they are short, cannot cause the voltage at N' to increase to such a level that the comparator 108a would respond.

When during a half-period of the "first" value K (K') is closed and N is connected to earth, the limitation of the current Ic1 to a very small value will prevent the rapid charging of the capcitance 110(C') and thus the passage of annoying short spurious signals, which are thereby eliminated.

The spurious signal B4 tends to maintain the situation controlled by the input and therefore presents no problems.

The amplitude of the spurious signal $B_1$ (smaller than $V_{eh}$-$V_{eb}$) is not sufficient to open the switch K, so that said spurious signal is not transferred on the voltage at N.

The amplitude of the spurious signal $B_2$ (which is equal to or higher than $V_{eh}$-$V_{eb}$) would be sufficient to open the switch K, but the very small value the current $I_{c1}$ limits the voltage variation at N to a very small value as a function of the duration of the spurious signal $B_2$. At N this spurious signal gives rise to a very small voltage increase $B'_2$. As it remains substantially smaller than $V_{nh}$, defined by the threshold $V_{T2}$ of the comparator 108a, it is not transferred.

It is obvious that a spurious signal which immediately follows $B_1$ or $B_2$ will be eliminated in a similar way.

FIG. 4 illustrates the case in which the integration time is smaller than half the duration of the "first" signal portions (in this case one half-period), spurious signals on "first" portions being eliminated in the same way if the integration time is greater than said half.

On the first half-period F10 of the "second" value the spurious signal B5 tends to maintain the situation controlled by the input, and therefore presents no problem.

Short positive spurious signals appearing when $V_a$ has its low level $V_{ab}$ and having an amplitude smaller than ($V_{eh}$-$V_{eb}$), for example B6, are not transmitted to N.

On the other hand, short positive spurious signals, appearing when $V_e$ has its low level $V_{eb}$ and having an amplitude equal to or greater than the difference between the threshold level $V_{T1}$-$V_{eb}$, are transferred at N.

In FIG. 4 two examples of this are the spurious signal B3, which appears at the time $t_5$ and disappears at the time $t_6$, and the spurious signal B7, which appears at the time t7 and disappears at the time t8. When such spurious signals appear they cause the capacitance 110 (C') to discharge and Vn to drop to its low level. Vn remains at its low level Vnb until the end of said spurious signal. At this instant a new charging cycle of the capacitance C' begins. For B3 this charging operation is interrupted by the closure of K K'. For B7 this charging operation enables N to reach the level Vnh at the time t9.

The consequences of the presence of such a spurious signal vary with the value of the duration of said half-period and the integration time of the first integrator and with the state of the spurious signal during said half-period of the "second" value.

In the case that said integration time is smaller than half said half-period of the "second" value (illustrated in FIG. 4), if the spurious signal appears at the beginning or the end of said half-period, at an interval from the end thereof which is smaller than the integration time W1, the voltage at point N will exhibit small peaks B'7 and B'3 lower than Vnh, which are not transferred by the comparator 108. The output pulse corresponding to the half-period carrying the spurious signals is transferred, but this presents no problem because the number of pulses has not changed, so that the counting operation is not effected. Indeed, in the case of B7, the instant t9 at which the voltage at N reaches Vnh being delayed, the instant at which JJ' is closed is also delayed. In the case B3, the instant t10 at which the voltage at N reaches Vnh being advanced, the instant at which J(J') opens is also advanced.

It is obvious that consecutive short spurious signals are eliminated in the same way.

In a similar way, but in a reciprocal manner, when said integration time W1 is greater than half said "second" portions (half-period for a uniform signal), if the spurious signal appears at the beginning or end of said portion at a distance from the end which is smaller than the difference between the duration of said half-period and the integration time, the number of pulses has not changed, so that the counting process is not affected.

It rarely happens that a large spurious signals appears in the middle of one of the pulses and in particular of a half-period in the case of a uniform signal; the 220 V power mains rarely contains spurious signals exceeding 110 V. These spurious pulses therefore have no influence on the input comparator and are consequently eliminated.

Figure 5:
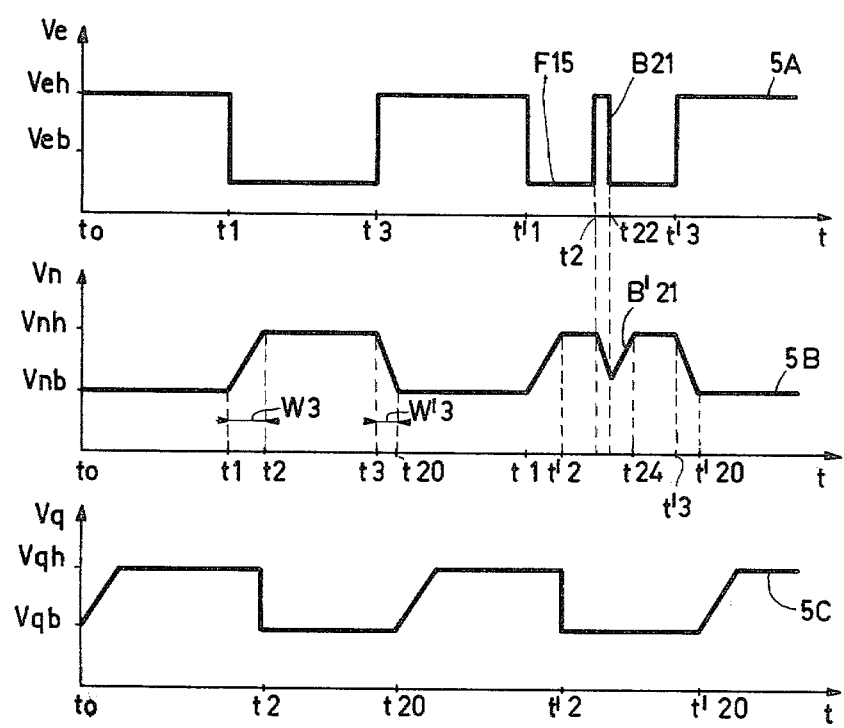
FIG. 5 shows how certain spurious signals are eliminated by increasing the discharge time of the first integrator.

In FIG. 5 the waveform 5A represents the voltage $V_e$ carrying a spurious signal $B_{21}$ in the middle of the second half-period $F_{15}$ of the "second" value, which spurious signal has an amplitude equal to the difference between the high level $V_{eh}$ and the low level $V_{eb}$. This spurious signal appears at the time $t_{21}$ and ends at the time $t_{22}$, the duration $t_{22}$-$t_{21}$ being for example of the order of 0.01 and 0.1 times the duration of the half-period.

The waveform 5B represents the voltage at N in the case that the discharge time W'3 of the capacitor of the first integrator is a third of its charging time W3. When at $t_3$ the switch K is closed, the voltage $V_n$ decreases from $V_{nh}$ to $V_{nb}$ in a time equal to $t_{20}$-$t_3$.

When at $t_{21}$ the spurious signals $B_{21}$ appears, the capacitor begins to discharge but this discharge is not terminated and $V_n$ is greater than $V_{nb}$ when at $t_{22}$ $V_e$ again reaches the value $V_{eb}$ at the end of the spurious signal $B_{21}$. The capacitor is recharged and the voltage at N reaches the value $V_{nh}$ at $t_{24}$. The spurious signal $B_{21}$ is transferred into $B'_{21}$, which does not reach the value $V_{nb}$.

The waveform 5C represents the voltage at Q for a second integrator which discharges immediately. The spike $B'_{21}$ of $V_n$ has no influence at all on $V_q$.

It may therefore be advantageous to have integrators with a discharge time up to 0.2 times the duration of the shortest of the portions for which said integrator is operative.

Figure 6:
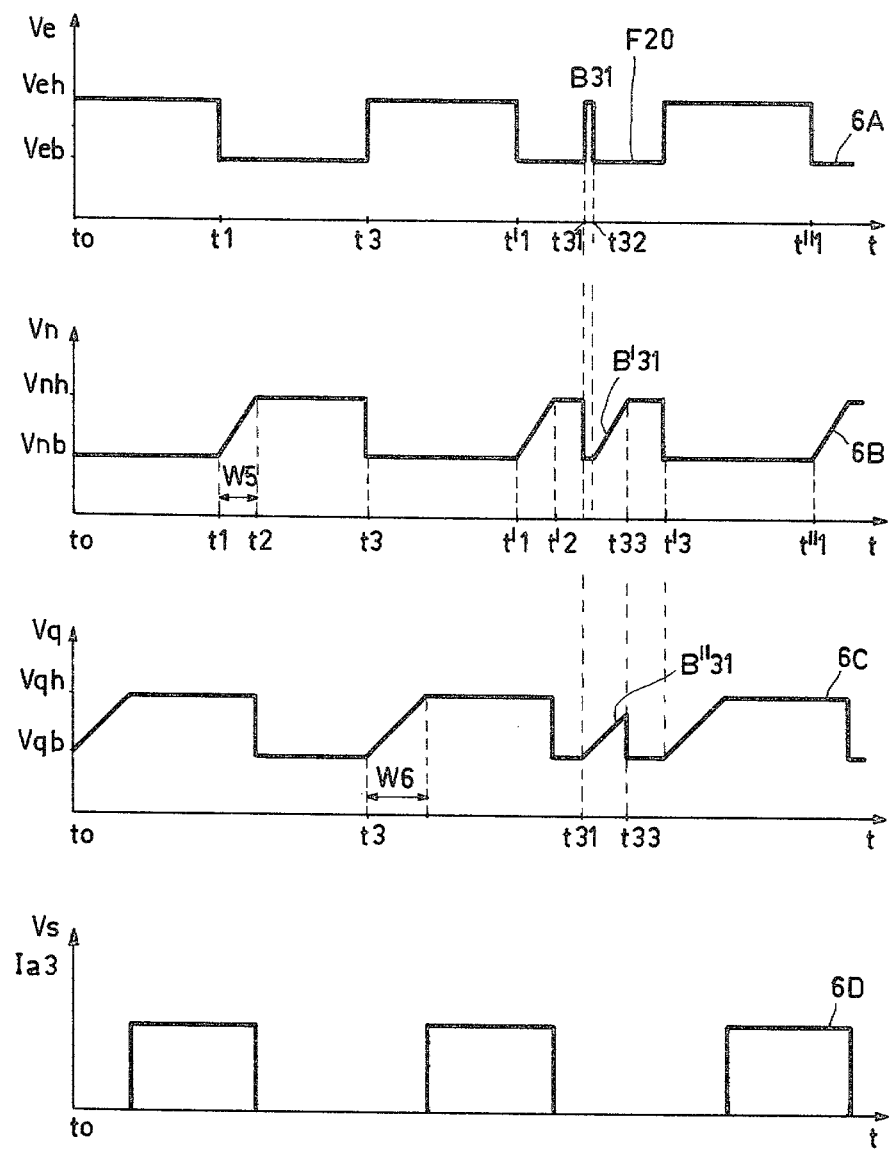
FIG. 6 shows how specific spurious signals are eliminated by increasing the integration time of the second integrator.

Waveform 6A in FIG. 6 represents the voltage $V_e$ carrying a spurious signal $B_{31}$ in the middle of the second half-period of the "second" value $F_{20}$, which spurious signal has an amplitude equal to the difference between the high level $V_{eh}$ and the low level $V_{eb}$. This spurious signal appears at the instant $t_{31}$ and terminates at the instant $t_{32}$, the duration $t_{32}$-$t_{31}$ being short relative to the integration time of the first integrator.

The waveform 6B represents the voltage at N for a first integrator whose integration time $W_5$ is a third of the half-period. At $t_{31}$ the spurious signal $B_{31}$, which causes the switch K to close, reduces $V_N$ from $V_{nh}$ to $V_{nb}$. At $t_{32}$ the switch K opens and the voltage at N, $V_n$, increases to $V_{nh}$, which it reaches at $t_{33}$ and at which value it remains till the time $t'_3$. The spurious signal $B'_{31}$ thus appears from $t_{31}$ to $t_{33}$.

The waveform 6C represents the voltage at Q for a second integrator whose integration time $W_6$ is longer than that of the first integrator, i.e. $\frac{2}{3}$ of the half-period in the Figure.

At the time $t_{31}$ the drop from $V_{nh}$ to $V_{nb}$ causes the capacitor 120 to charge. As the integration time $W_6$ of the second integrator is greater than the sum, $t_{33}$-$t_{31}$, of the duration of the spurious signal $t_{32}$-$t_{31}$ and the integration time $W_5$ of the first integrator, this charging process is interrupted before $V_Q$ reaches $V_{qh}$. As a result of this the spurious signal $B''_{31}$ is rejected by the output comparator. The waveform 6C represents the output signal. Counting is not disturbed.

It may therefore be advantageous to give the second integrator an integration time between 1 time and 2 times the integration time of the first integrator.

Figure 7:
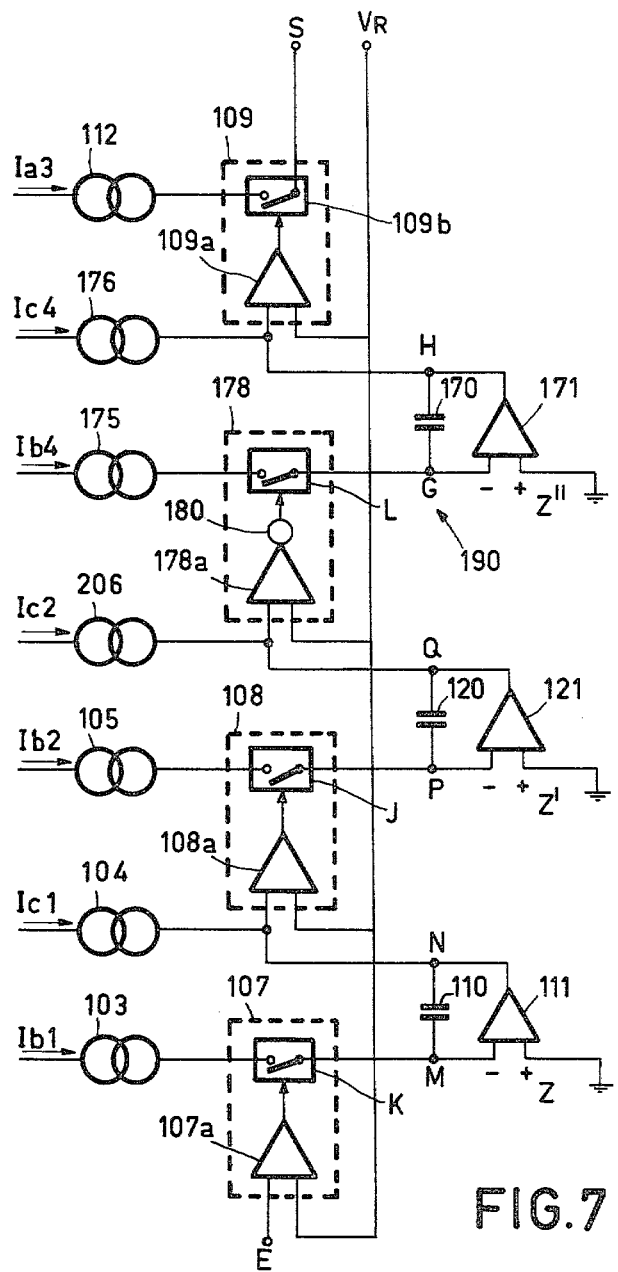
FIG. 7 is a circuit diagram of a filter in accordance with the invention comprising three integrators.

All spurious signals can be eliminated in a reliable manner by selecting integrators having an integration time smaller than or equal to 0.5 times the duration of the portions or half-periods having the "second" value and by including between the output of the second integrator and the output threshold-comparator an additional voltage-inverting integrator which is similar or identical to said first and second integrators and preceded by an inverter. FIG. 7 shows the device of FIG. 1 to which an additional integrator 190 has been added between the output Q of the second integrator and the output comparator 109a. The elements corresponding to FIG. 1 have the same reference numbers except for the integration current source of the second integrator which is now referenced 206.

The additional integrator 190 is constituted by a voltage-inverting current amplifier 171, whose non-inverting input Z″ is connected to earth and whose inverting input G and whose output A are interconnected by a capacitor 170, and by a constant-integration-current source 176 supplying a current $I_{c4}$ and connected to the output H of the amplifier 171.

The inverting input G of the amplifier is connected to a constant-control-current source 175 supplying a current $I_{b4}$ via an arrangement 178 constituted by a switch L, controlled by a threshold comparator 178a, and an inverter 180.

The input of the threshold comparator 178a is controlled by the output Q of the second integrator, the comparator being furthermore connected to the reference voltage VR. The output of H of the integrator 190 is connected to the input of the output comparator 109a.

The integrator 190 operates in exactly the same way as the integrators described in the foregoing.

Figure 8:
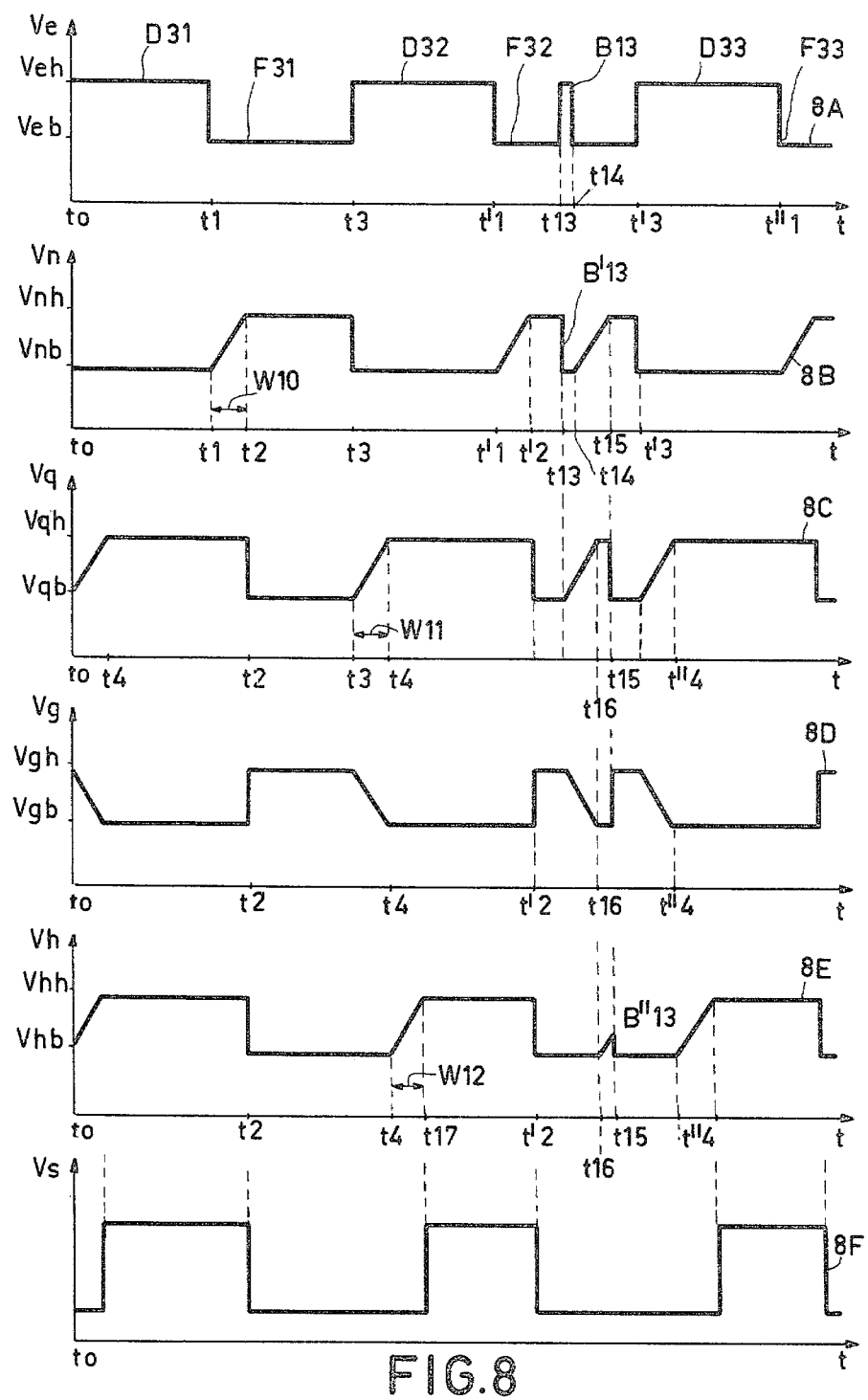
FIG. 8 shows how certain spurious signal are eliminated by the filter shown in FIG. 7.

In FIG. 8 the waveform 8A, as a function of the time t, represents three periods of the voltage with the half-period T at the input, $V_e$ (whose high level is $v_{eh}$ and whose low level is $V_{eb}$). The first ($D_{31}$ from $t_0$ to $t_1$), the third ($D_{32}$ from $t_3$ to $t'_1$), the fifth ($D_{33}$ from $t'_3$ to $t''_1$) half-periods have the "first" value, i.e. they are filtered by the first integrator 101. The second ($F_{31}$ from $t_1$ to $t_3$), fourth ($F_{32}$ from $t'_1$ to $t_3$) and sixth ($F_{33}$, which starts at $t''1$) half-periods have the "second" value. In the middle of $F_{32}$ a spurious signal $B_{13}$ is shown which starts at $t_{13}$ and terminates at $t_{14}$ and whose amplitude is equal to Veh-Veb.

The curve 8B represents the voltage at N, Vn, whose high level is Vnh and whose low level is Vnb. The integration time of the first integrator is $W_{10} = t_2 - t_1$. It is of the order of a third of T. The discharge time W'10 is substantially zero, discharging being effected almost instantaneously.

At the time t13, when the voltage $V_e$ reaches the value $V_{eh}$, the switch K K' is closed. Vn, which had its high level since the instant t'2, decreases from Vnh to Vnb, subsequently starting from t14, switch K (K') opens, capacitor 110 is charged and Vn again reaches the level Vnh at the time t15, t15 appearing before t'3, from which instant, the half-period being terminated, Vn returns to its low level. The spurious signal B13 is transformed into B'13, which divides a half-period in two.

The curve 8C represents the voltage at Q, $V_q$, whose high level is Vqh and whose low level is Vqb. The integration time of the second integrator is $W_{11} = t_4 - t_3$. It is of the order of a third of T. The discharge time W'11 is also substantially zero.

As a result of the closure of the switch J the voltage at Q, which is at its high level Vqh until t'2, then drops to its low level current Vqb, at which level its remains until t13.

When at t13 the spurious signal B13, causing the voltage Vn to go from its high level to its low level, causes the switch J-J' to open, capacitor 120 is progressively charged and the voltage Vqb goes from its low level to its high level Vqh, which is finally reached at t16 and which it retains until t15.

At t15, Vnh which has reached its high-level causes the switch J to close and Vq returns to its low level Vqb at which it remains until t'3, from which instant capacitor 120 is recharged until at t″4 the voltage at Q reaches its high level Vqh at which it remains for the whole duration of the third half-period D33 of the "first" value.

The waveform 8D represents the voltage at G whose shape is exactly the inverse of the voltage at Q.

The waveform 8E represents the voltage at H, Vh, which changes from a high level $V_{hh}$ to a low level Vhb. The integration time W12 of the third integrator is equal to t17-t4. It is of the order of a third of T. The discharge time of W'12 is virtually zero.

At t2, the high level Vgh of the voltage at G causes the switch L to close and the voltage at H assumes its low level Vhb, which it retains until t4. At t3 Vg changes from its high level to its low level which is reached at t4, switch L opens and capacitor 170 is charged until t17, at which instant Vh reaches its high level Vhh which it retains until the instant t'2.

At the instant t'2, the change of Vg to its high level Vgh causes the switch L to be closed, the voltage at H decreases and remains at its low level till t16. At t16, when the voltage at g reaches its low level, L is opened, but the charging process of the capacitor 170 is interrupted at t15 because L is closed again and remains closed until t''4. The large spurious signal B13 is thus transformed into a minimal spurious signal B''13 having an amplitude which is too small to reach the comparator 109a.

The waveform 8F represents the output voltage whose number of pulses is the same as that of the input voltage. Thus, the counting process is not disturbed by the spurious signal B13.

Figure 9:
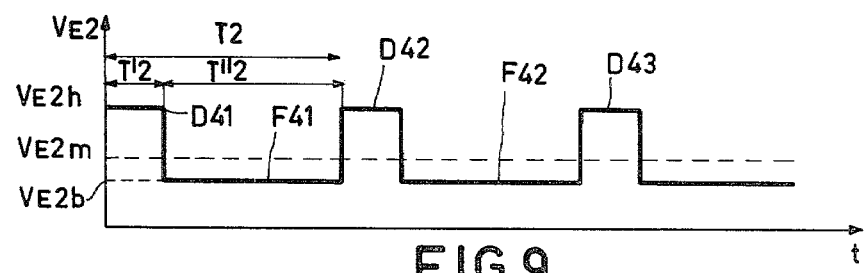
FIG. 9 represents a periodic pulse-shaped input signal.

FIG. 9 represents a periodic signal with a period $T_2$ comprising portions (D41, D42, D43) in the form of short voltage-pulses with a duration T'2 (duty cycle $R_1 = T'_2/T_2$) with a level $V_{E2h}$ which in the Figure is situated above an average value $V_{E2m}$, and portions (F41, F42) in the form of long pulses having a duration T''2 (duty cycle $R_2 = T''_2/T_2$) with a level $V_{E2b}$ situated below said average value in the Figure.

In order to filter a signal of this shape, the two integrators of the filter in accordance with the present invention should preferably be different, the integration time of the integrator which is operative for the short pulses preferably being between 0.30 and 1 times the duration T'2 of said short pulse, and the integration time of the integrator which is operative for the long pulses lying between 0.30 and 1 times the duration T''2 of said long pulse. The integrators are proportioned exactly as described in the foregoing.

The present invention may be used for all duty cycles.

Figure 10:
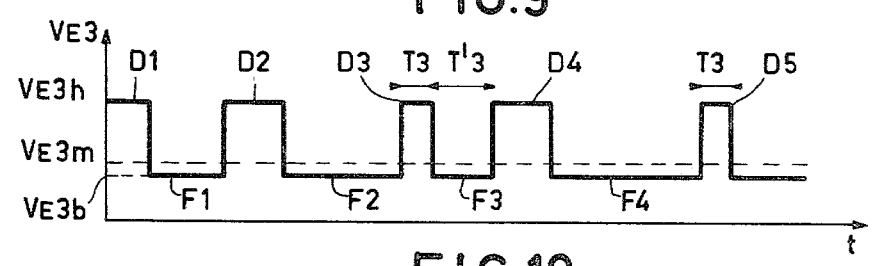
FIG. 10 represents a non-periodic pulse-shaped input signal.

FIG. 10 represents a non-periodic data transmission signal, comprising five pulses, $D_1$, $D_2$, $D_3$, $D_4$, $D_5$ of variable duration whose high level is $V_{E3h}$, which is situated above an average value $V_{E3m}$. The duration of the shortest pulses $D_3$ and $D'_4$ has a known value $T_3$. Said positive pulses are spaced by intervals $F_1$, $F_2$, $F_3$, $F_4$, also of variable duration with a level $V_{E3b}$ below $V_{E3m}$, the shortest interval $F_3$ also having a known value T'3.

In order to filter a signal of this shape with a device in accordance with the present invention, the integrator which is adapted to filter the pulses $D_1$, $D_2$, $D_3$ should preferably have an integration times substantially between 0.3 and 1 time the duration of $T_3$ of the shortest pulse $D_5$, and the integrator which is adapted to filter the signal during the pulse intervals should have an integration time which is substantially between 0.3 and 1 times the duration of T'3 of the shortest interval $F_3$.

In most cases the NPN-transistors of the diagrams described hereinafter may be replaced by PNP-transistors and vice versa: the changes which this involves will be obvious to those skilled in the art.

Figure 11:
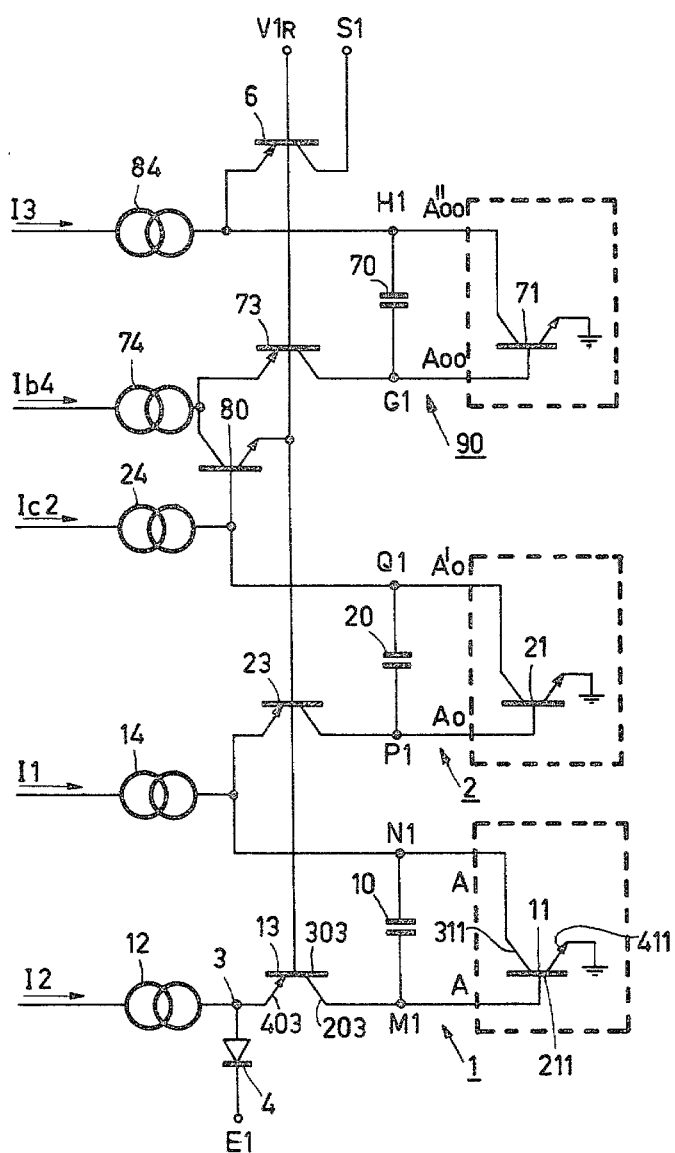
FIG. 11 is a diagram of an embodiment of the filter in accordance with the invention in which the amplifiers are realized with bipolar transistors; and FIGS. $12_A$, $12_B$, $12_C$, $12_D$, $12_E$ represent five variants of the amplifiers.

In FIG. 11 the first inverting integrator is designated 1, the second integrator is designated 2, and an additional inverting integrator 90 precedes the inverting threshold comparator 80.

The first integrator specifically comprises a capacitor 10 of which a first plate is connected to the base of the NPN amplifier transistor 11 via $M_1$, which transistor is connected in common emitter arrangement, its collector 311 being connected to the output and its emitter 411 to earth.

The second plate of said capacitor 10 is connected to the collector 311 of said transistor 11 via $N_1$.

The first integrator also comprises the constant-integration-current source 14, which is connected to point $N_1$.

Furthermore, the constant-control-current source 12 is connected to the common point $M_1$ via PNP transistor 13, to whose emitter 403 it is connected via 3, whilst the collector 203 of said switching transistor 13 is connected to point $M_1$. The transistor 13 itself performs the function of the arrangement 107 in FIG. 1, which arrangement is constituted by the switch K controlled by the threshold comparator 107a, the base 303 being driven by the reference voltage $V_1R$.

The second integrator specifically comprises a capacitor 20, of which a first plate is connected to the base of the NPN amplifier transistor 21 via $P_1$, which transistor is connected in common emitter arrangement, its emitter being connected to earth, and the second plate of said capacitor is connected to the collector of said transistor 21 via $Q_1$.

Said second integrator also comprises the constant-integration-current source 24 which is connected to point $Q_1$. Furthermore, the source 14 is connected to point $P_1$ via the PNP switching transistor 23, to whose emitter it is connected, while the collector of said switching transistor 23 is connected to point $P_1$ and its base to the reference voltage $V_1 R$.

Thus, the source 14 not only functions as constant-integration-current source of the first integrator, but also as constant-control-current source of the second integrator, the transistor 23 having the function of the arrangement 108 in a similar way as the transistor 13 has the function of the arrangement 107.

The additional integrator 90 specially comprises a capacitor 70 of which a first plate is connected to the base of the NPN amplifier transistor 71, connected in common emitter arrangement, via G1, its emitter being connected to earth, and of which the second plate is connected to the collector of said transistor 71 via H1.

Said additional integrator also comprises the constant-integration-current source 84, which is connected to point H1, and a source 74 supplying a constant control current Ib4. The source 74 is connected to the common point G1 via the PNP transistor 73, to whose emitter it is connected, the collector of said switching transistor 73 being connected to point G1. The transistor 73 thus functions as a switch.

Between the second integrator and the additional integrator the inverting threshold comparator 80 is included. More specifically, the output Q1 of the second integrator is connected to the base of the NPN inverter transistor 80, whose emitter is connected to the reference voltage VR and whose collector, which receives the current Ib4 from the source 74, is connected to the emitter of the switching transistor 73.

The constant-current source 84 is not only connected to point H1, but also to the emitter of the transistor 6, whose collector is connected to the output and whose base is connected to the reference voltage $V_{1R}$. Transistor 6 performs the function of the arrangement 109 (output comparator 109a and switch 109b) and the constant-current source 84 the function of the output source 112. Thus, in a similar way as the source 14, the current source 84 performs two functions, 51 being the output of the filter.

The common point 3 between the emitter of the transistor 13 and the current source 12 constitutes the actual input of the filter. This input is preceded by a diode 4 which isolates it from the input terminal $E_1$ and which prevents an external current from said input from flowing into the filter when said input is high.

The four transistors 13, 23, 73 and 6 are connected in common-base arrangement, their emitters being connected to the current sources (12, 14, 74 and 84 respectively) and the collectors of the three first transistors (13, 23 and 73) to the first plate of the corresponding capacitor, while the collector of the transistor 6 constitutes the output. Their bases are supplied in parallel with the reference voltage $V_1 R$.

It is to be noted that in this arrangement the threshold voltages $V_T$ of the switching comparators 13, 23, 73 and 6 differ from $V_1R$ by the value VEB of the internal emitter-base voltage; thus, they are equal to $V_1R+0.5$ V; the high level $V_{E1h}$ of the input voltage should be higher than this value and the low level of the input voltage should be lower than this value.

Transistors 11, 21 and 71 are each shown in a frame, because they may be replaced by one of the arrangements, described hereinafter with reference to FIG. 12 and included between the pairs of points A and A', Ao and A'o, Aoo and A'oo. The voltages at $E_1$, $M_1$, $N_1$, $P_1$, $Q_1$ $G_1$, $H_1$, $S_1$ are designated $V_{E1}$, $V_{M1}$, $V_{N1}$, $V_{P1}$, $V_{Q1}$, their high levels being indicated by the index h and their low levels by the index b, the voltage applied to the bases of the transistors 13, 23, 73 and 6, i.e. the reference voltage, being designated $V_1R$, the internal base-emitter voltages by $V_{BE}$ and the internal collector-emitter voltages of a transistor by $V_{CE}$ (and if saturated by $V_{CE}$sat), which designations are followed by the number of the relevant transistor.

When the switching transistor 13 is not conductive, the current sources 12 and 14 can supply current and $V_1R$ is applied. This is the same for the switching transistors 23 and 73, the corresponding current sources being 14, 24 and 74, 84 respectively, while the high levels are:

$V_{M1h}=V_{P1h}=V_{P1h}=VBE_{11}=VBE_{21}=$
$CBE_{71}=0.7$ V.

The current cannot flow in the base connection of the transistor 11, transistor 21 or transistor 71 unless the corresponding transistor is conductive.

N1, Q1, H1 have their high levels, equal to VT, when transistors 11, 21 and 71 are not conductive.

$V_{N1h}=V_{Q1h}=V_{H1h}=V1R+VBE$ (23, 73, 6)=V1R+0.5 V=VT and if VIR=3 V,
VT=$V_{N1h}=V_{Q1h}=V_{H1h}=3.5$ V.

The threshold voltage $V_T$, which should be below the high level of the input signal (for example 5 V), should also be higher than the voltage on the bases of the amplifier transistors 11, 21 and 71 when these are conductive (0.7 V). The low levels are the following:

$V_{M1b}=V_{P1b}=V_{G1b}=0.6$ V during normal operation.

The voltages at $M_1$, $P_1$, $G_1$ vary little and just fluctuate about the internal base-emitter voltages of the transistors 11, 21 and 71, because they are not operated in an on/off mode. The situation is slightly different at the instant of starting, but this is irrelevant for the present invention.

$V_{N1b}=V_{Q1b}=V_{G1b}=V_{CEsat}$ of the corresponding transistor=0.1 V.

When $N_1$, $Q_1$ and $G_1$ have their low levels, the corresponding transistor is saturated and its base is high.

When the first plate of a capacitor is at its high level (0.7 V), the second plate of said capacitor will be at its low level (0.1 V) and the capacitor will be charged in such a way that said first plate will be at a substantially higher voltage than said second plate.

When the voltage on the first plate of said capacitor decreases below 0.7 V (for example to 0.6 V), the corresponding transistor is desaturated and owing to the Miller effect this desaturation is slow; the voltage on the second plate increases to its high level (3.5 V). The capacitor is discharged and is subsequently recharged in an inverse sense, the voltage on its second plate attaining a value which is higher than that on the first plate. The equivalent charge variation corresponding to the potential variation of $N_1$ of 3.4 V is then 1 nanocoulomb for a 3 pF capacitor and a $\beta$ of 100.

In the first integrator, when the input voltage goes to its high level, for example 5 V, transistor 13, which was cut off, is turned on, the current $I_1$ from the source 12 flows in the branch $M_1$, and capacitor 10 is charged very rapidly, the charging time being dependent on the current $I_1$ supplied by the source 12. The voltage at $M_1$ goes rapidly from its low level to its high level and becomes higher than the voltage at $N_1$, which goes from its high level to its low level. Transistor 11 is saturated and the current $I_2$ from the source 14 flows in the branch $N_1$.

In the steady state the current $I_1$ no longer flows in the branch $M_1$ and is drained via diode 4 and input $E_1$.

Transistor 11 remains saturated for substantially one half-period of the input voltage, which is 1 millisecond or 10 milliseconds, the voltage at $N_1$ having its low level and the current $I_2$ flowing continuously in the branch $N_1$.

When the input voltage $V_{E1}$ drops to zero, transistor 13, which was conductive, is cut off, the current $I_1$ no longer flows in the branch $M_1$ and is drained via diode 4 and input $E_1$. The slow desaturation of transistor 11 mentioned in the foregoing now begins. During this desaturation, the voltage at $M_1$ slowly decreases to its low level and the voltage at $N_1$ increases to its high level, the current $I_2$ flows in the branch $N_1$ (transistor 23 is not conductive) and discharges the capacitor and recharges it in a sense opposite to the previous sense, the voltage at $N_1$ becoming higher than the voltage at $M_1$. For the charge values given in the foregoing and a current $I_2$ of 3 $\mu$A this process of desaturation will take 0.3 milliseconds. It is to be noted that the integration time determines the value of $I_2$, but that the value of $I_1$ may be substantially smaller, 10 or 15 times, if $\beta$ is 1000. In fact, $I_1$ is given the same value as $I_2$ for reasons of simplicity.

After the desaturation period has ended the voltages at $M_1$ and $N_1$ remain stable as long as the input voltage $V_{E1}$ remains low. No current flows in branch $M_1$ ($I_1$ flowing via the diode 4 and the input E) and in branch $N_1$ ($I_2$ flowing in the branch $P_1$, because $N_1$ has reached its high level of 3.5 V, transistor 23 is turned on).

This situation continues until the input voltage $V_{E1}$ goes to the high state and, transistor 13 being turned on, the current $I_1$ discharges capacitor 10 and recharges it in an opposite sense, the voltage at $N_1$ decreases from the high level to the low level, the voltage at $M_1$ increases, and the cycle recommences.

The second integrator operates in exactly the same way as the third integrator and the first integrator functions in the same way as those preceding it, except that NPN transistor 80 functions as comparator and inverter and PNP transistor 73 solely acts as a switch for the control current $I_{b4}$. At the output PNP transistor 6 both functions as output comparator and as output switch.

In the diagram of FIG. 11 transistors 11, 21 and 71, which constitute the amplifiers 111, 121 and 171 of FIG. 7 and which are shown in a frame in FIG. 11, may be replaced by the various arrangements shown in FIG. 12 between points A and A', $A_o$ and $A'_o$ or $A_{oo}$ and $A'_{oo}$, the inputs being A', $A'_o$ or $A'_{oo}$ and the outputs being A', $A'_o$ or $A'_{oo}$.

In the arrangement 12A, said amplifiers are constituted by a bipolar transistor 81, whose base 81 constitutes the input $A_1$, which transistor is also connected in common-emitter arrangement, but whose emitter 281 and collector 381 have been reversed, the emitter 281 being connected to the second plate of the capacitor and thus to the amplifier output $A'_1$ and the collector 381 being connected to earth. In this case the current gain $\beta$ is of the order of 5.

In the arrangement 12B, the amplifiers are constituted by combination 31 of two bipolar transistors of the same type, the first one 31a being the input transistor, the second one 31b the output transistor, the two transistors being connected in common-emitter arrangement in a "normal Darlington" configuration, the emitter 131 of the first transistor, whose base 231 constitutes the input $A_2$ of said amplifier, being connected to the base 431 of the second transistor, whose emitter 531 is connected to earth.

The base 231 of the input transistor is connected to the first plate of the corresponding capacitor, the collectors 331 and 631 are both connected to the output $A'_2$ and to the second plate of said capacitor. The current gain factor $\beta$ is equal to the product of the current gain factors of the two transistors which, because they are of the NPN-type, lies between 80 and 200 for each of them. The input transistor, which operates at a very small current, may have a much lower gain, i.e. between 60 and 100. Thus, the gain factor of the Darlington arrangement lies between 4800 and 20,000. In fact, if the value of the capacitor is known with a tolerance of ±20%, it is for example possible to obtain a $\beta$ of the order of 6000 to 7000. As a result of this the "equivalent capacitance" for a 3-pF capacitor will be of the order of 20 nF (for the above values between 15 and 25).

With an integration-current source of $3/\mu A$ the integration times $W_{15}$ and $W_{16}$ will be of the order of 7 milliseconds per volt across the capacitor.

In the above example, which is easy to realize, the variation of the potential on terminal $N_1$ of the capacitor is approximately 3 V, so that the integration time will be of the order of 21 milliseconds, i.e. longer than one half-period at a frequency of 50 Hz (10 milliseconds).

Since it is easy to obtain such an integration time with a "normal" Darlington amplifier, this constitutes a preferred solution for the filtration of very low frequencies. It is evident that an integration time which prolongs the charging time of the capacitor beyond the duration of the half-period of the desired frequency would eliminate said frequency. For example, in order to filter the power supply current, it suffices to reduce the gain $\beta$ and/or to increase the value of the integration current; as a slightly larger current will enable better reproducible sources to be obtained, this presents an additional advantage.

The value of the cut-off frequency above which the spurious signals are eliminated depends on the integration time; those frequencies are eliminated which are higher than the frequency corresponding to the integration time.

Figure 12A:
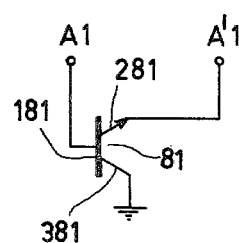
Figure 12B:
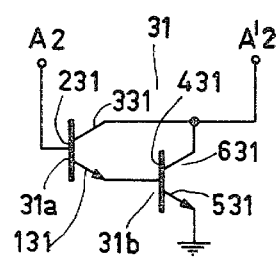
Figure 12C:
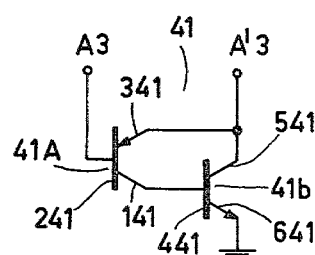
Figure 12D:
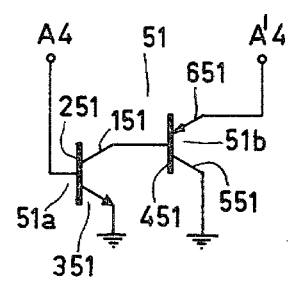
Figure 12E:
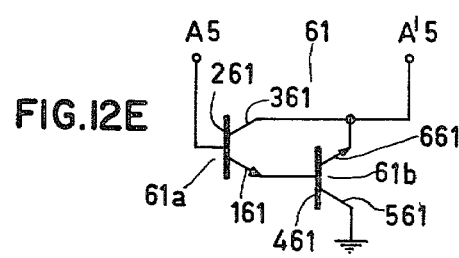

In the arrangements of FIG. 12C and FIG. 12D, the amplifiers 41 (FIG. 12C) and 51 (FIG. 12D) are constituted by so-called "mixed Darlingtons" with two transistors of opposite types, one input transistor and one output transistor, the collector of the input transistor being connected to the base of the output transistor.

In the arrangement 12C, the input $A_3$ of the amplifier 41 is constituted by the base 241 of the PNP input transistor 41a, whose emitter 341 is connected to the second plate of the capacitor and to the collector 541 of the output transistor 41b, which point constitutes the output $A'_3$ of the amplifier. The collector 141 of the input transistor is connected to the base 441 of the output transistor. The emitter 641 of the output transistor is connected to earth.

In the arrangement 12D, the input $A_4$ of amplifier 51 is constituted by the base 251 of the NPN input transistor 51a, whose emitter 351 is connected to earth. The output transistor 51b is a PNP transistor, whose collector 551 is connected to earth and whose emitter 651 is connected to the output $A'_4$ of the amplifier. The collector 151 of the input transistor is connected to the base 451 of the output transistor.

Since PNP-transistors always have a current gain factor which is smaller than that of NPN-transistors, the current gain factor (product of the current-gain factors of the two transistors constituting the circuit) is of the order of 1000. As a result of this the "equivalent capacitance" for a 3 pF capacitor will be 3 nF, and for a $2/\mu A$ integration-current source the integration time will be 4.5 milliseconds.

This integration time is suitable for filtering current of the European or the American power frequency.

In certain cases mixed Darlington circuits may have topological advantages.

In the arrangement 12E, the amplifiers 61 are constituted by a combination of two transistors of the same type (NPN in the Figure), one input transistor 61a and one output transistor 61b. In this arrangement the input $A_5$ is constituted by the base 261 of the output transistor, whose collector 561 is connected to earth. The collector 361 of the input transistor and the emitter 661 of the output transistor are both connected to the second plate of the corresponding capacitor and constitute the output $A'_5$ of the amplifier.

In this arrangement the current gain factor of the input transistor is of the order of 80 and that of the output transistor is of the order of 5, so that the gain factor of the arrangement will be of the order of 400.

With a 3 pF capacitor and an integration current of 2/μA, the integration time will be 0.6 milliseconds.

The filter in accordance with the present invention may be realized by means of discrete elements. Suitably, it may also be realized in the form of a monolithic integrated circuit: the various elements can be integrated, for example on a silicon monocrystal, whose substrate of a first conductivity type (for example P) is provided with an epitaxial layer of an opposite type (for example N) in the form of islands which are insulated from each other. In order to realize the device use is made of commonly known techniques: epitaxy, diffusion, metallization, which need not be described in the present context. The capacitors which have a capacitance of a few picofarads and which are necessary for realizing the invention can readily be obtained, in particular by MOST technology (metal oxide semiconductor), which is a well-known integrated circuit technology. The possibility of using capacitors of such a low value, which are thus integratable, constitutes one of the principal advantages of the present invention.

What is claimed is:

1. A low-pass filter for low-frequency signals having first signal portions situated on one side and second signal portions situated on the opposite side of an average value comprising:

a first and a second voltage inverting integrator connected in series with each other, said first integrator being mainly operative for said first portions and said second integrator for said second portions, each of said integrators comprising a voltage-inverting current amplifier between whose inverting input and output a capacitor is included, the non-inverting input being connected to a point of fixed voltage, said integrator further comprising an input threshold comparator and an output threshold comparator, and a constant-integration-current source connected to the output of said amplifier, said inverting input of said amplifier being connected to a constant-control-current source of said integrator via a switch controlled by said input threshold comparator, the input to said filter being connected to said input threshold comparator of said first integrator, said output of said first integrator being connected to said input threshold comparator of said second integrator, said output of said second integrator being connected to said output threshold comparator that is connected to the output of said filter, the capacitance values of said capacitors, the current gain factors of said amplifiers, the currents supplied by said current sources, the relative level of the input voltage and the threshold voltages of said threshold comparators are such that the integration time of each of said integrators is greater than 0.1 and smaller than 1 times the duration of the shortest of the signal portions for which said integrator is operative, and that the discharge time of each of said integrators is, at the most, equal to said integration time of said integrator.

2. A low-pass filter as claimed in claim 1 wherein between said output of said second integrator and the input of said output threshold-comparator of said second integrator there is included an additional voltage-inverting integrator which also comprises:

an additional voltage-inverting current amplifier between whose inverting input and output an additional capacitor is included, the non-inverting input of said amplifier being connected to a point of fixed voltage, and an additional constant-integration-current source connected to the output of said amplifier, said inverting input of said additional amplifier being connected to a constant-control-current source of said additional integrator via a switch controlled by an inverting threshold-comparator whose input is connected to the output of said second integrator, the output of said additional integrator being connected to said output threshold-comparator whose output is connected to the output of the filter, the capacitance values of said capacitors of said three integrators, the current gain factors of said amplifiers, the currents supplied by the current source, the relative level of the input voltage and the threshold voltages of the comparators are such that the integration time of each of said integrators is greater than 0.1 and smaller than 0.5 times the duration of the shortest of said second signal portions, and that the discharge time of each of said integrators is, at the most, equal to said integration time of said integrator.

3. A filter as claimed in claim 1 wherein the integration time of said integrators is greater than 0.3 times the duration of the shortest of the signal portions for which said integrator is operative.

4. A filter as claimed in claim 1, wherein the integration time of said integrators is smaller than 0.7 times the duration of the shortest of the signal portions for which said integrator is operative.

5. A filter as claimed in claim 1 wherein at least the discharge time of the capacitor of the first integrator lies between 0.1 and 0.2 times the duration of the shortest of the signals portions for which said integrator is operative.

6. A low-pass filter as claimed in claim 1 wherein the integration time of the second integrator lies between 1 and 2 times the integration time of the first integrator.

7. A low-pass filter as claimed in claim 1 wherein the point of fixed voltage to which the non-inverting input of the amplifier of the first integrator is connected, is the same as the point of fixed voltage to which the non-inverting input of at least one of the amplifiers of the other integrators of the filter is connected.

8. A low-pass filter as claimed in claim 1 wherein the integration-current source of the first integrator and the control-current source of the second integrator are constituted by a single source.

9. A low-pass filter as claimed in claim 1 wherein said filter comprises an output-current source and said output threshold comparator controls the state of a switch included between said output-current source and an output tapping of the filter.

10. A low-pass filter as claimed in claim 9, wherein said integrator-current source of the last integrator and said output-current source are constituted by a single source.

11. A low-pass filter as claimed in claim 1 further comprising a diode in the reverse direction included between the input and said input threshold comparator.

12. A low-pass filter as claimed in claim 1 wherein said integrators are substantially identical.

13. A low-pass filter as claimed in claim 1, wherein an input threshold comparator and the switch which it controls are realized by a bipolar transistor, of which one of the main electrodes is connected to the current source the other to the input of the corresponding amplifier and the base to the reference voltage.

14. A low-pass filter as claimed in claim 1 wherein at least one of said amplifiers is constituted by two bipolar transistors of the same type, the first one being the input transistor and the second one being the output transistor, which transistors are connected in "normal Darlington" arrangement, the emitter of the first transistor, whose base constitutes the input of said amplifier, being connected to the base of the second transistor, whose emitter is connected to ground, the collectors of said two transistors being interconnected and being connected to the corresponding integration-current source and constituting the output of said amplifier.

15. A filter as claimed in claim 14 wherein the various elements are integrated on a monolithic semiconductor chip.

* * * * *